United States Patent
Taki et al.

(10) Patent No.: US 7,679,373 B2
(45) Date of Patent: Mar. 16, 2010

(54) TRIMMING CIRCUIT, ELECTRONIC CIRCUIT, AND TRIMMING CONTROL SYSTEM

(75) Inventors: Konosuke Taki, Sendai (JP); Hidetaka Fukazawa, Taiwa-cho (JP)

(73) Assignee: Freescale Semiconductor, Inc., Austin, TX (US)

( * ) Notice: Subject to any disclaimer, the term of this patent is extended or adjusted under 35 U.S.C. 154(b) by 792 days.

(21) Appl. No.: 11/548,853

(22) Filed: Oct. 12, 2006

(65) Prior Publication Data

US 2007/0080739 A1 Apr. 12, 2007

(30) Foreign Application Priority Data

Oct. 12, 2005 (JP) ............... 2005-297812

(51) Int. Cl.
*H01H 85/30* (2006.01)
(52) U.S. Cl. ............... 324/550; 438/467; 365/96
(58) Field of Classification Search ............... 324/550; 327/525; 438/467, 601; 365/96, 225.7
See application file for complete search history.

(56) References Cited

U.S. PATENT DOCUMENTS

| | | | | |
|---|---|---|---|---|
| 5,384,727 A | * | 1/1995 | Moyal et al. | 365/225.7 |
| 5,412,594 A | * | 5/1995 | Moyal et al. | 365/225.7 |
| 5,731,733 A | * | 3/1998 | Denham | 327/525 |
| 5,731,760 A | * | 3/1998 | Ramirez | 365/225.7 |
| 6,711,077 B2 | * | 3/2004 | Sung | 365/225.7 |

FOREIGN PATENT DOCUMENTS

JP 2004214580 A 7/2004

\* cited by examiner

*Primary Examiner*—Timothy J Dole
(74) *Attorney, Agent, or Firm*—Charles Bergere

(57) ABSTRACT

A trimming circuit, an electronic circuit, and a trimming control system for reducing the risk of failures when perform trimming and for ensuring that a desired device is readily manufactured. A selector, a resistor, and a fuse are connected in series between a power supply and ground. A probe pad for performing probe trimming is connected immediately above the fuse. The selector includes two back-to-back connected n-type MOS transistors. Each n-type MOS transistor has a gate terminal connected to a selector control circuit. A trim sense circuit is arranged at a power supply side of the fuse. The trim sense circuit detects fuse breakage and changes the operation of an element associated with each trimming circuit TC based on the detection.

5 Claims, 2 Drawing Sheets

TRIMMING CIRCUIT, ELECTRONIC CIRCUIT, AND TRIMMING CONTROL SYSTEM

BACKGROUND OF THE INVENTION

The present invention relates to a trimming circuit, an electronic circuit, and a trimming control system for an electronic circuit, such as a semiconductor device, for adjusting electrical characteristics of the electronic circuit.

In a semiconductor integrated circuit, a fuse may be used to realize a desired operation setting or a desired adjustment. For example, an electronic circuit, such as a semiconductor device, may use a trimming circuit to adjust the characteristics of the electronic circuit. The trimming circuit changes the resistance through the switch operation of a transistor and includes a fuse circuit for performing such a switching operation. The fuse circuit has a plurality of fuses and controls the switch operation of a trim sense circuit corresponding to each fuse by breaking or not breaking each fuse.

When trimming is executed, "probe trimming" is often performed in the prior art (refer to, for example, Japanese Laid-Open Patent Publication No. 2004-214580). To enable probe trimming, a probe pad is arranged in a trimming circuit. Current is supplied to the probe pad to break a fuse. The breaking of the fuse results in the adjustment of a resistor or other elements connected via a trim sense circuit in a subsequent stage. Probe trimming is advantageous in that it ensures the breaking of a fuse.

However, the characteristics of a semiconductor device may change after packaging. For example, the application of stress to a chip subsequent to molding may result in an assembly shift, which would change the band gap. As a result, the voltage at a reference power supply or the like would change.

To solve this problem, "package trimming", which is performed after packaging, has recently been developed. As shown in FIG. 2, to enable package trimming, a current supply circuit 30 is connected to a fuse F, which is grounded. An n-type MOS transistor T1, a resistor, and a diode D1 are connected in series in the current supply circuit 30. The n-type MOS transistor T1 is connected to a power supply PS. A gate terminal of the n-type MOS transistor T1 is connected to a selector control circuit 12. The selector control circuit 12 selects the fuse F that is to be broken. The diode D1 is used for electrostatic discharge (ESD) protection and prevents backflow of a current, which would break the fuse F.

The selector control circuit 12 specifies the fuse F that is to be broken and activates the n-type MOS transistor T1 to supply current to the fuse F from the power supply PS. As a result, trimming is performed. Such trimming performed after packaging enables the assembly shift or the like to be readjusted.

In package trimming, a current supply circuit supplies current to a fuse and causes the fuse to break. Thus, package trimming requires current of at least a predetermined value to break the fuse. However, depending on the characteristics of the current supply circuit or the fuse (e.g., depending on variations of the fuse resistor), a sufficient amount of current may not be supplied.

In particular, package trimming has high process dependency. Therefore, package trimming may fail to enable sufficient trimming when package trimming is performed on a device that is manufactured with new processes and includes a current supply circuit or fuses with varying characteristics.

SUMMARY OF THE INVENTION

Accordingly, the present invention provides a trimming circuit, an electronic circuit, and a trimming control system that reduce the risk of failing to perform trimming and ensure that the desired device is readily manufactured through trimming.

One aspect of the present invention is a trimming circuit including a fuse, arranged between a power supply and ground, and connected to a trim sense circuit for detecting breakage of the fuse. The trimming circuit includes a probe pad for performing probe trimming at a power supply side of the fuse. A trimming selecting means performs package trimming is arranged at the power supply side of the fuse.

A further aspect of the present invention is a trimming control system provided with a wafer tester including a trimming execution means. The trimming control system further includes a package tester and a trimming management data storing means, which stores lot identification information for identifying a lot manufactured in a common process and which stores circuit identification information for locating a trimming circuit in the lot. The package tester takes a measurement indicating the result of package trimming performed with a trimming circuit. When detecting a defect in the package trimming, the package tester locates the trimming circuit having the defect and stores position information of that trimming circuit in the trimming management data storing means. The wafer tester executes probe trimming on a trimming circuit at the location stored in the trimming management data storing means in a subsequent lot.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
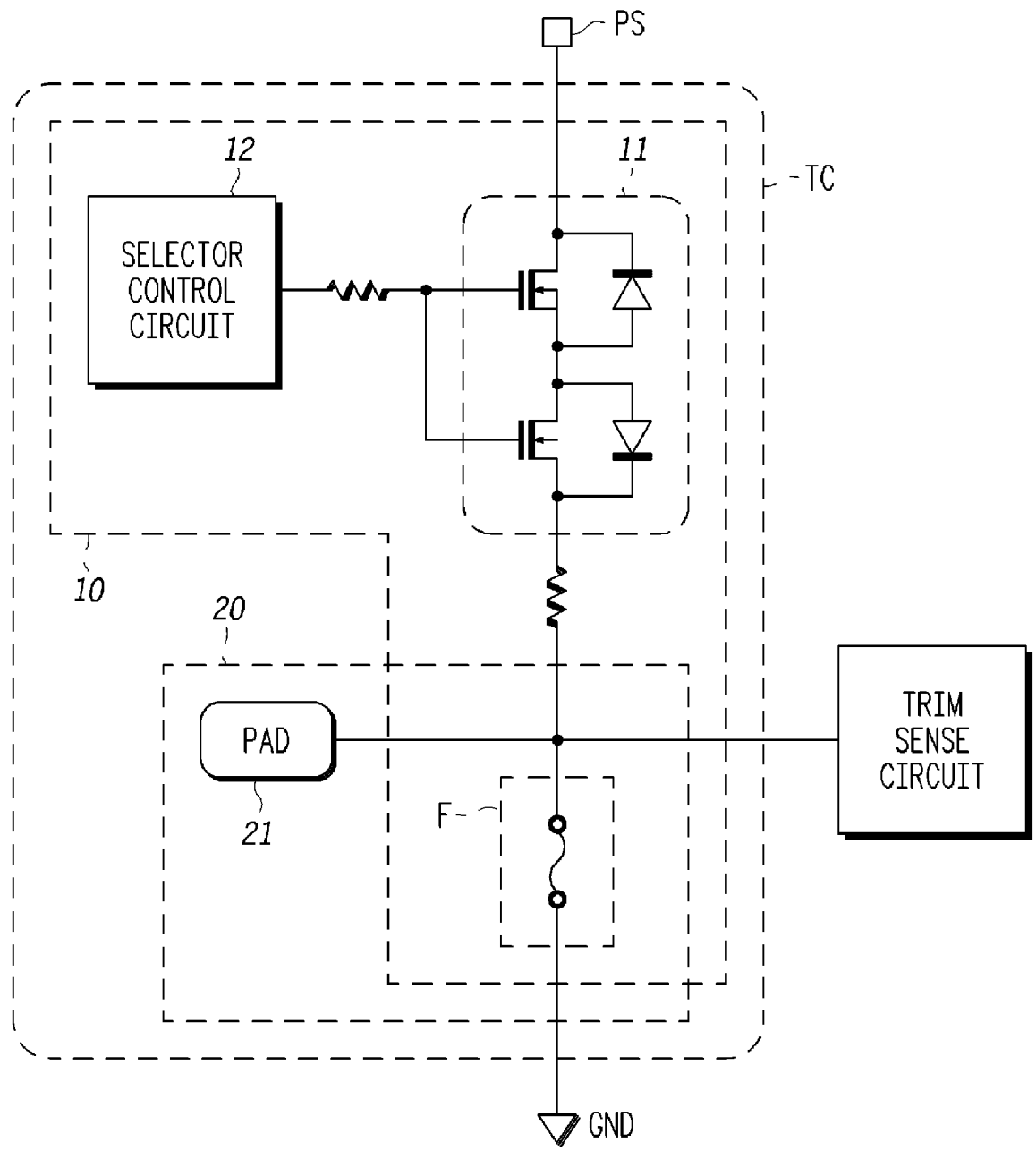
FIG. 1 is a schematic diagram of a trimming circuit according to a preferred embodiment of the present invention.
Figure 2:
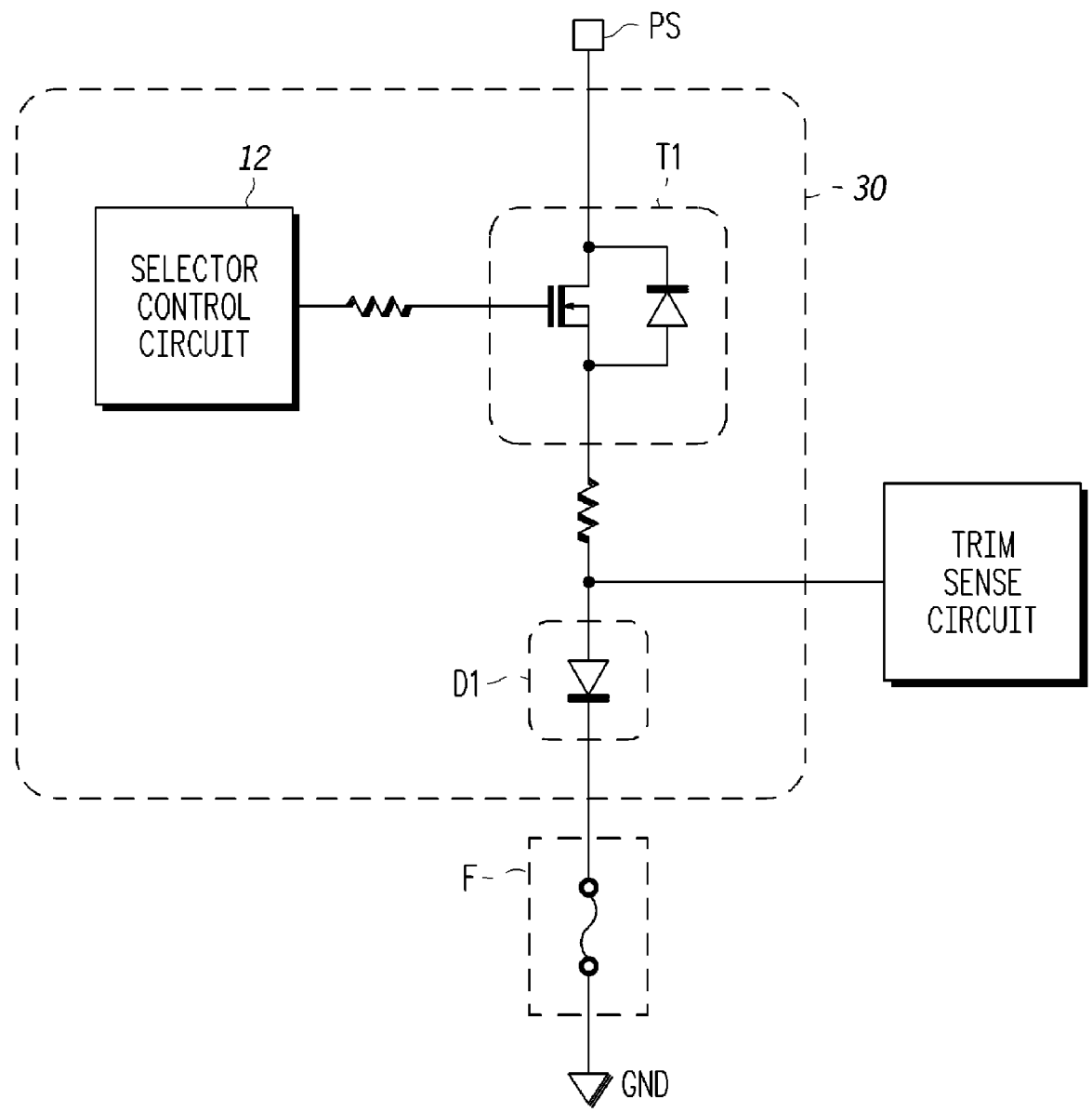
FIG. 2 is a schematic diagram of a conventional trimming circuit.

A trimming circuit according to a preferred embodiment of the present invention will now be described. The trimming circuit is applied to a reference voltage generation circuit of a semiconductor device. The reference voltage generation circuit includes a plurality of trimming circuits. A trim sense circuit is connected to each trimming circuit. FIG. 1 shows the basic structure of a trimming circuit TC in accordance with an embodiment of the present invention. The trimming circuit TC includes a selector 11, a resistor, and a fuse F, which are connected in series between a power supply PS and ground GND. A probe pad 21 for performing probe trimming is connected to a position immediately above the fuse F.

The selector 11 is formed by two n-type MOS transistors, which are back-to-back connected. Each n-type MOS transistor has a gate terminal, which functions as a control terminal and which is connected to a selector control circuit 12. The selector 11 and the selector control circuit 12, which functions as a control means, function as a trimming selecting means for selecting the fuse F that is to be broken.

A trim sense circuit is arranged at the power supply side of the fuse F. The trim sense circuit detects the breakage of the fuse and changes the operation of an element associated with each trimming circuit TC based on the detection.

A method for performing trimming using the trimming circuit TC will now be described.

First, a circuit test is conducted on a wafer to determine whether trimming is necessary. When it is determined that trimming is necessary, probe trimming is performed. In detail, current is supplied from the probe pad 21 to cause fuse breakage.

After adjustment is made through probe trimming, the wafer is divided into chips and packaging is performed by carrying out a mold process. Further, a circuit test is conducted on the package to determine whether trimming is necessary. When it is determined that trimming is necessary, package trimming is performed. In detail, the selector control circuit 12 selects the fuse F, which is to be broken, and activates the transistor of the selector 11. As a result, a current is supplied from the power supply PS to cause fuse breakage.

After package trimming is performed, a circuit test is conducted again. When package trimming fails to enable sufficient trimming, readjustments are made during the subsequent probe trimming for the next wafer.

The preferred embodiment has the advantages described below.

In the preferred embodiment, the trimming circuit TC includes the selector control circuit 12 and the selector 11 in addition to the probe pad 21. Probe trimming is performed with the probe pad 21 to ensure trimming. Further, package trimming is performed with the selector control circuit 12 and the selector 11 to correct assembly shift and the like that occur after packaging. Further, when package trimming fails to enable sufficient trimming, probe trimming is performed to make readjustments. This readily carries out corrections without requiring mask changes.

In the preferred embodiment, the selector 11 is formed by the two back-to-back connected n-type MOS transistors. If a diode for ESD protection were to be used like in the prior art, voltage that is greater than or equal to the rise voltage Vf would be necessary. In the preferred embodiment, the MOS transistors easily generate current from a low source-drain voltage Vds. This enables reduction in the voltage required to supply current that breaks the fuse F.

In the above embodiment, the selector 11 is formed by the two back-to-back connected n-type MOS transistors. This structure does not limit the polarity of the voltage applied to the probe pad 21 and increases the degree of freedom of the circuit. In the preferred embodiment, a negative voltage may be applied to the probe pad 21. Further, since the MOS transistors are back-to-back connected, probe trimming prevents backflow of the package trimming power supply PS.

In the above embodiment, the probe pad 21 is connected to the position immediately above the fuse F. In this case, only the fuse F is arranged between the probe pad 21 and the ground GND. Thus, probe trimming requires only a minimum amount of current for fuse breakage.

It should be apparent to those skilled in the art that the present invention may be embodied in many other specific forms without departing from the spirit or scope of the invention. Particularly, it should be understood that the present invention may be embodied in the following forms.

In the preferred embodiment, the trimming circuit TC uses the n-type MOS transistors. However, the present invention is not limited to such a structure. For example, other transistors, such as p-type MOS transistors or bipolar transistors, may be used. When p-type MOS transistors are used, a VCC line is set at a potential lower than the ground potential.

In the preferred embodiment, a circuit test is conducted on a package to determine whether trimming is necessary. When it is determined that trimming is necessary, package trimming is performed. Then, a circuit test is conducted again after package trimming is performed. When package trimming is not sufficient, readjustments are made for the circuit test and trimming performed on the next wafer. This process may be automated.

More specifically, a trimming control system including a wafer tester and a package tester may be used. The wafer tester has a trimming execution means. In this case, each lot is given an identifier (lot identification information) for identifying the lot. Further, trimming circuits included in the lot are each given an identifier (circuit identification information) for identifying the trimming circuit.

The trimming control system further includes a trimming management data storing means for storing lot identification information, which is used to identify lots manufactured in the same process, and circuit identification information, which is used to identify trimming circuits in the lots. In the package tester, measurements indicating the results of package trimming performed on each trimming circuit TC are taken after package trimming is performed. When a defect in the package trimming is detected, the location of a trimming circuit TC having the defect is identified, and information relating to the identified location of the trimming circuit TC is stored into the trimming management data storing means. In this case, when the wafer tester detects the common lot stored in the trimming management data storing means, the wafer tester executes probe trimming at the location of the trimming circuit TC recorded in the trimming management data storing means. As a result, package trimming and probe trimming used in combination enable efficient trimming. Accordingly, problems that are not corrected by package trimming are corrected by probe trimming. This enables the desired device to be readily manufactured.

The present examples and embodiments are to be considered as illustrative and not restrictive, and the invention is not to be limited to the details given herein, but may be modified within the scope and equivalence of the appended claims.

What is claimed is:

1. A trimming circuit including a fuse, arranged between a power supply and ground, and connected to a trim sense circuit for detecting breakage of the fuse, the trimming circuit comprising:

a probe pad for performing probe trimming at a power supply side of the fuse; and a trimming selecting means for performing package trimming arranged at the power supply side of the fuse, wherein the trimming selecting means includes two back-to-back connected transistors and a control means connected to a control terminal of each transistor.

2. The trimming circuit according to claim 1, wherein the transistors are formed by n-type MOS transistors.

3. An electronic circuit comprising:
the trimming circuit according to claim 1; and
a trim sense circuit connected to each trimming circuit.

4. A trimming circuit, comprising:
a fuse arranged between a power supply and ground;
a resistor coupled between the fuse and the power supply;

a trim sense circuit for detecting breakage of the fuse, the trim sense circuit connected to a node between the fuse and the resistor;

a probe pad for performing probe trimming coupled to the node between the fuse and the resistor; and a selector for performing package trimming coupled between the resistor and the power supply, wherein the selector includes two n-type MOS transistors connected in series between the resistor and the power supply, and wherein a control circuit is connected to a gate terminal of each transistor.

5. The trimming circuit of claim 4, further comprising two diodes respectively connected across each of the transistors.

* * * * *